United States Patent
Bagga

(10) Patent No.: US 8,446,217 B2
(45) Date of Patent: May 21, 2013

(54) DUAL-LOOP FEEDBACK AMPLIFYING CIRCUIT

(75) Inventor: Sumit Bagga, Delft (NL)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/054,036

(22) PCT Filed: Jul. 17, 2009

(86) PCT No.: PCT/EP2009/059267
§ 371 (c)(1),
(2), (4) Date: Mar. 10, 2011

(87) PCT Pub. No.: WO2010/007177
PCT Pub. Date: Jan. 21, 2010

(65) Prior Publication Data
US 2011/0148527 A1    Jun. 23, 2011

Related U.S. Application Data

(60) Provisional application No. 61/081,548, filed on Jul. 17, 2008.

(51) Int. Cl.
*H03F 3/68*    (2006.01)

(52) U.S. Cl.
USPC ............. 330/104; 330/82; 330/195; 330/188

(58) Field of Classification Search
USPC .................... 330/82, 195, 188, 104
See application file for complete search history.

(56) References Cited

U.S. PATENT DOCUMENTS 2,576,145 A * 11/1951 Rudkin ............................ 330/65
2,742,616 A *  4/1956 Merrill, Jr. ..................... 333/216
2,909,623 A    10/1959 Blecher
3,144,564 A *  8/1964 Sikorra ........................ 327/335
3,242,442 A *  3/1966 Ishimoto et al. .............. 331/183
3,435,360 A    3/1969 Carroll
5,130,674 A *  7/1992 Pham et al. ................... 331/109
6,100,758 A *  8/2000 Klemmer ....................... 330/252

(Continued)

FOREIGN PATENT DOCUMENTS

DE    910427    3/1954
EP    0591032    4/1994
GB    951720    3/1964

OTHER PUBLICATIONS

International Search Report and Written Opinion, International Patent Application No. PCT/EP2009/059267 dated Oct. 16, 2009.

(Continued)

*Primary Examiner* — Patricia Nguyen
(74) *Attorney, Agent, or Firm* — McDonnell Boehnen Hulbert & Berghoff LLP

(57) ABSTRACT

An amplifying circuit arranged for converting an input signal into an amplified output signal comprising: an input node (11) at an input side of said circuit for receiving said input signal (pi); an output node (9) at an output side of said circuit for outputting said amplified output signal (io); a first gain element (M1) connected between said input and output nodes and provided for converting an input voltage taken from said input signal into a current for forming said amplified output signal; a negative feedback loop (3) over said first gain element, said negative feedback loop having first elements (5, 6) arranged for providing input matching; and a positive feedback loop (2) over said first gain element, said positive feedback loop having second elements (7, 8) arranged for providing additional input matching and gain enhancement of said first gain element.

12 Claims, 7 Drawing Sheets

U.S. PATENT DOCUMENTS

| | | | |
|---|---|---|---|
| 6,172,563 | B1 | 1/2001 | Trask |
| 7,082,004 | B2 * | 7/2006 | Kajiyama et al. ............... 360/46 |
| 2007/0290745 | A1 | 12/2007 | Vitzilaios et al. |

OTHER PUBLICATIONS

Reiha, Michael T. et al., "A 1.2 V Reactive-Feedback 3.1-10.6 GHz Low-Noise Amplifier in 0.13 um CMOS", IEEE Journal of Solid-State Circuits, vol. 42, No. 5, May 2007, pp. 1023-1033.

"Part 15.4: Wireless Medium Access Control (MAC) and Physical Layer (PHY) Specifications for Low-Rate Wireless Personal Area Networks (WPANs)", IEEE Standard 802.15.4a, 2007, 203 pages.

"Part 11: Wireless LAN Medium Access Control (MAC) and Physical Layer (PHY) Specifications, High-Speed Physical Layer in the 5 GHz Band", IEEE Std. 802.11a-1999, 91 pages.

\* cited by examiner

DUAL-LOOP FEEDBACK AMPLIFYING CIRCUIT

Cross-Reference to Related Applications

The present application is a U.S. National Stage of PCT Application No.: PCT/EP2009/059267, filed on Jul. 17, 2009. The PCT/EP2009/059267 application claims priority to U.S. Provisional Application No.: 61/081,548, filed on Jul. 17, 2008. The entire contents of the PCT/EP2009/059267 and 61/081,548 applications are incorporated herein by reference.

TECHNICAL FIELD

The invention relates to circuits and operation methods for said circuits, for example for amplifying signals, in particular said circuits and methods are suitable for use in narrowband, broad-/(ultra-) wide-band (preferably above 1 GHz) telecommunication systems.

BACKGROUND ART

FIG. 1 shows a typical single loop negative feedback amplifier as known in the art. Here the output current ($i_o$) is sensed (through the secondary ($I_{s,0}$) of transformer $x_0$) and applied to the input of $M_1$ (through the primary of the transformer ($I_{p,0}$)), thereby resulting in the current-to-current transfer. For the voltage-to-current transfer, the intrinsic transconductance ($g_{m1}$) of device $M_1$ is used. With these two relationships (i.e., $g_{m1}$ of $M_1$ and turns ratio of $x_0$), input impedance of the amplifier can be set to the desired value. Since there are only two design variables, the design has as drawback a trade-off between the wanted gain and input impedance.

DISCLOSURE OF THE INVENTION

It is an aim of the invention to provide an amplifying circuit which does not show the drawbacks of the prior art.

This aim is achieved with an amplifying circuit according to claim 1.

In the present invention an amplifying circuit is provided for converting an input signal into an amplified output signal. The amplifying circuit comprises:
an input node at an input side of the circuit for receiving the input signal ($p_i$);
an output node at an output side of the circuit for outputting the amplified output signal ($i_o$);
a first gain element connected between the input and output nodes and provided for converting an input voltage taken from the input signal into a current for forming the amplified output signal;
a negative feedback loop over the first gain element, the negative feedback loop having first elements arranged for providing input matching; and
a positive feedback loop over the first gain element, the positive feedback loop having second elements arranged for providing additional input matching and gain enhancement of the first gain element.

As a result of these features, the amplifying circuit of the invention is more flexible from the viewpoint of design variables. As a result, the circuit can achieve a low noise performance, can be made suitable for high frequency signals, can be intrinsically broad-/wide-band with high gain. In particular, the first gain element in combination with the negative feedback loop can result in (a) an increased linearity of the circuit with respect to the linearity of the first gain element taken alone and/or (b) impedance matching (enabling realization of a sufficiently low-ohmic real and/or complex input impedance). The further combination with the positive feedback loop can be used to provide additional impedance matching and can result in an increased/enhanced voltage gain/transconductance of the circuit with respect to the voltage gain/transconductance of the first gain element taken alone. By introducing a positive feedback loop as third variable, the trade-off problem discussed for the prior-art designs can be relaxed.

The invention allows for the design of circuits that meet strict design criteria of emerging high frequency applications with existing technology, such as CMOS technology combined with transformers, which have recently become available. Circuits designed according to the invention can exploit the benefits of each feedback loop as well as the interaction effects between the feedback loop via two intertwined loops, for example.

In a preferred embodiment, the first gain element comprises a first transistor (M1) having a gate connected to the input node. In another embodiment, the first gain element comprises a cascade of transistors.

In an embodiment, the amplifying circuit further comprises a second gain element arranged for forming an output current buffer. Preferably, the second gain element comprises a second transistor having programmable biasing conditions for programming the impedance and gain of the amplifying circuit. Preferably, the second transistor comprises a gate connected to a programming node for receiving programming voltage (Vbias). By adding this output buffer (preferably between the output of the first gain element and the output of the amplifying circuit), the impedance and gain of the amplifying circuit can be made programmable. An intermediate voltage (being the voltage seen across the source of the second gain element) can be controlled by changing the biasing conditions of the second gain element, thereby changing the input impedance and gain. In an alternative embodiment, a controllable load can be connected at the output of the amplifying circuit for making the gain programmable, for example by adding a LC-tank with varactors of capacitor banks.

To realize a low noise, low power circuit with moderate/high linearity (e.g. >−10 dB), the negative and the positive feedback loop may be realized with passive elements (resistors, capacitors, inductors and transformers). To be operable within a specific frequency range (i.e., band-pass response) and achieve low noise figure, reactive elements like capacitors, inductors, transformers may be preferred.

In an embodiment, the first elements of the negative feedback loop comprise primary and secondary windings of a first transformer arranged in non-inverting configuration. Further, the primary winding of the first transformer is arranged for sensing the current and the secondary winding of the first transformer is arranged for adding the sensed current to a gate of the first gain element.

In an embodiment, the second elements of the positive feedback loop comprise primary and secondary windings of a second transformer arranged in inverting configuration. Further, the primary winding of the second transformer is arranged for sensing a voltage on output side of the circuit related to the output signal and the secondary winding of the second transformer is arranged for adding the sensed voltage to a gate of the first gain element.

In other words, the negative feedback loop exploits a transformer, for conversion of current into current, in particular, with one part of the transformer in the output signal path and another part of the transformer being connected to the input of the gain element. The positive feedback also exploits a transformer, for conversion of voltage into current, in particular, with one part of the transformer in the input signal path, and another part of the transformer being connected to the output of the gain element. Transformers are frequency selective devices (sensing both current and voltage) often used in low-power circuits for impedance matching and maximum power transfer. Efficient transformers consume little power (i.e., relatively low insertion loss) and save energy. The feedback loops may also be realized by active elements to achieve the same functionality.

In an embodiment, the positive and negative feedback loops comprise nested transformers. The feedback loops are 'intertwined' or nested together rather than in series and/or parallel configuration, such that potential instability caused by the positive feedback loop is at least in balance or dominated by the stabilizing effect of the negative feedback loop. The desired gain, impedance and noise levels of the amplifier are set by the turn ratios and coupling coefficients of the transformers and the transconductances of the gain stages.

Some embodiments may include independent biasing the first gain element, and in some embodiments, self-biasing can be achieved. Also, the frequency characteristics of the disclosed circuits can be programmed by using controllable elements, such as varactors, a group of paralleled capacitor banks, etc. Other reactive elements could be used as well.

In an embodiment, the amplifying circuit further comprises at least one LC network connected to a ground terminal of the secondary winding of the first and/or second transformer, for forming a notch in the pass-band of the amplifying circuit. In another embodiment, the at least one LC network comprises variable capacitors.

In an embodiment an UWB communication device comprises an amplifying circuit as provided in the present invention. This implies that the components of the amplifying circuit are adapted for amplification of UWB signals, preferably above 1 GHz.

In some embodiments, the circuit may be a CMOS and/or SiGe BiCMOS and/or SiGe HBT and/or GaAs and/or InP or any other semiconductor technology.

In a preferred embodiment, the circuit is designed in standard sub-micron (90 nm) CMOS technology. Here, the negative-positive feedback topology improves the overall gain and the third-order input intercept point (IIP3) (a measure of linearity) beyond what is achievable with single feedback only designs (at a certain power budget), and also gives a greater degree of design freedom in matching the input impedance to any desired value (real and/or complex).

BRIEF DESCRIPTION OF THE DRAWINGS

The invention will be further elucidated by means of the following description and the appended figures.

MODES FOR CARRYING OUT THE INVENTION

Figure 1:
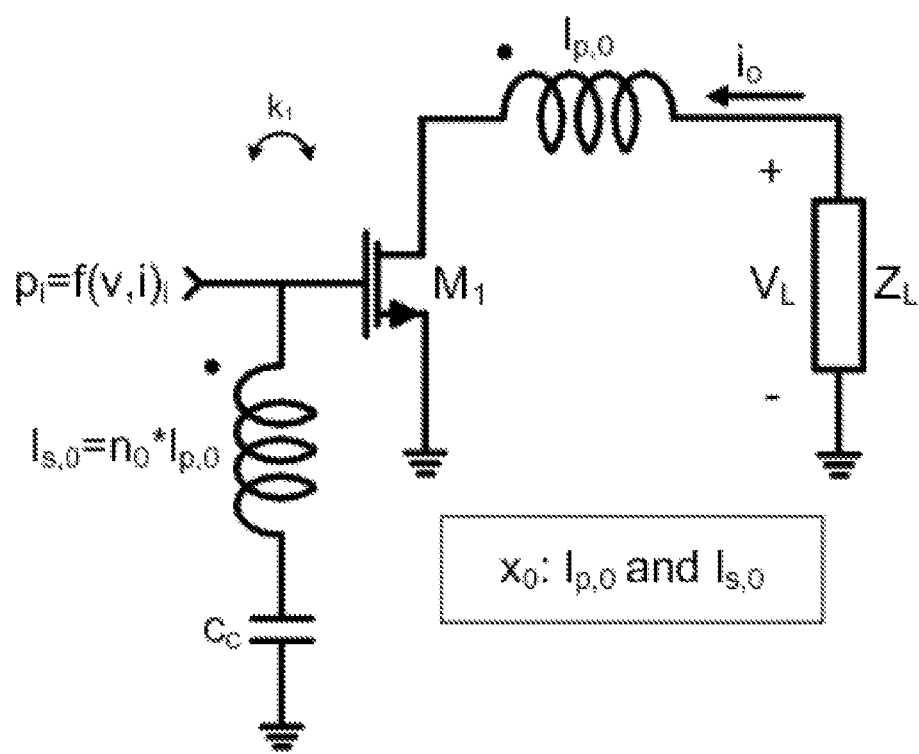
FIG. 1 shows a single-loop negative feedback amplifier.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting of only components A and B. It means that with respect to the present invention, the only relevant components of the device are A and B.

Below, a dual-loop amplifier of a preferred embodiment of the invention is described for the use in radio frequency (RF) front-ends, like for example impulse-radio (IR) ultra-wideband (UWB) radios (e.g., IEEE 802.15.4a). The amplifier is power-to-current (P-I) configured and employs dual reactive loops, whereby both loops are interdependent: (i) a positive feedback loop to enhance the overall gain in combination with (ii) a negative feedback loop (dominant) to guarantee stability and for orthogonal impedance and noise matching over a desired bandwidth (e.g., 6-10.6 GHz). The amplifier can be fabricated in 90 nm CMOS.

Negative feedback is often the leading candidate for broadband amplification as it promises numerous benefits, such as, insensitivity towards process and supply variations, stabilization of gain, lower distortion, larger bandwidth (at the expense of gain) and orthogonal noise and impedance matching. According to the invention, we use negative and positive feedback loops to enhance the gain of the amplifier while preserving the aforementioned parameters.

As an example, a low-power, single-stage (i.e., cascode) power-to-current (P-I) amplifier with a notch >10 dB in the WLAN band is introduced to meet the 802.15.4a specifications. This amplifier employs reactive dual-loop negative and positive feedback and is fabricated in standard 0.90 nm TSMC CMOS technology. Further, the next fundamentals and specifications are followed:
1. Minimum amplifier gain (S21) and noise figure (NF) requirements: >15 dB with a noise figure (NF) <5 dB.
2. Typical linearity (IIP3 is a measures of linearity) value(s): >−10 dBm.
3. Narrowband interference requirements (out-of-band and inband filtering to increases interference immunity): 1-3 dB insertion loss and >20 dB in-band rejection at NBI. Typical methods: a) on-chip: LC ladder filters (e.g., Elliptic, Chebyshev, etc.) and b) LTCC Low Temperature Co-fired Ceramic (LTCC) or other passive devices (out-of band rejection >20-40 dB).
4. Design methodology/trade-off: High gain, low noise figure, without compromising on linearity.

Figure 2:
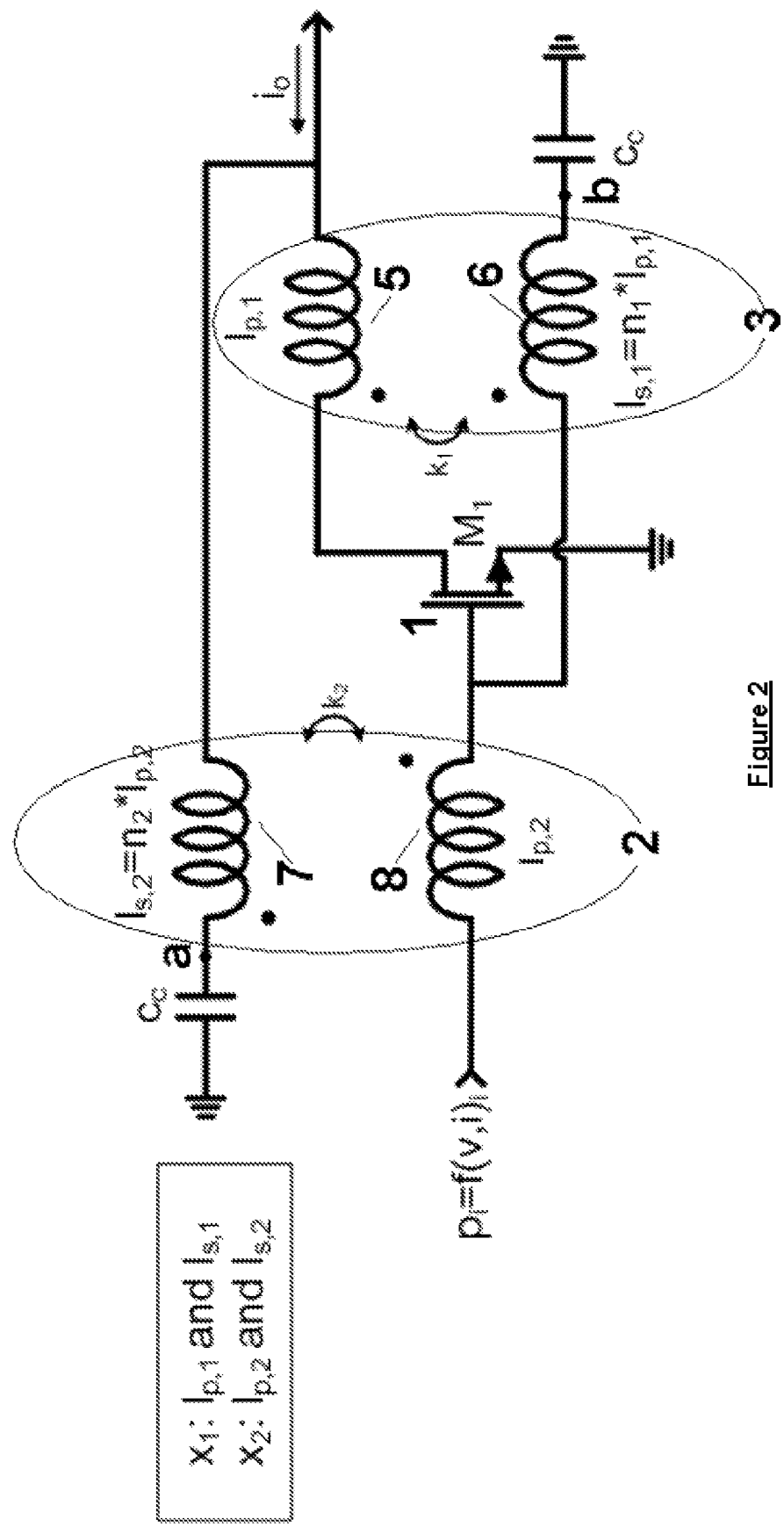
FIG. 2 shows a first preferred embodiment of an amplifying circuit of the invention, in particular a dual-loop feedback amplifier.
Figure 3:
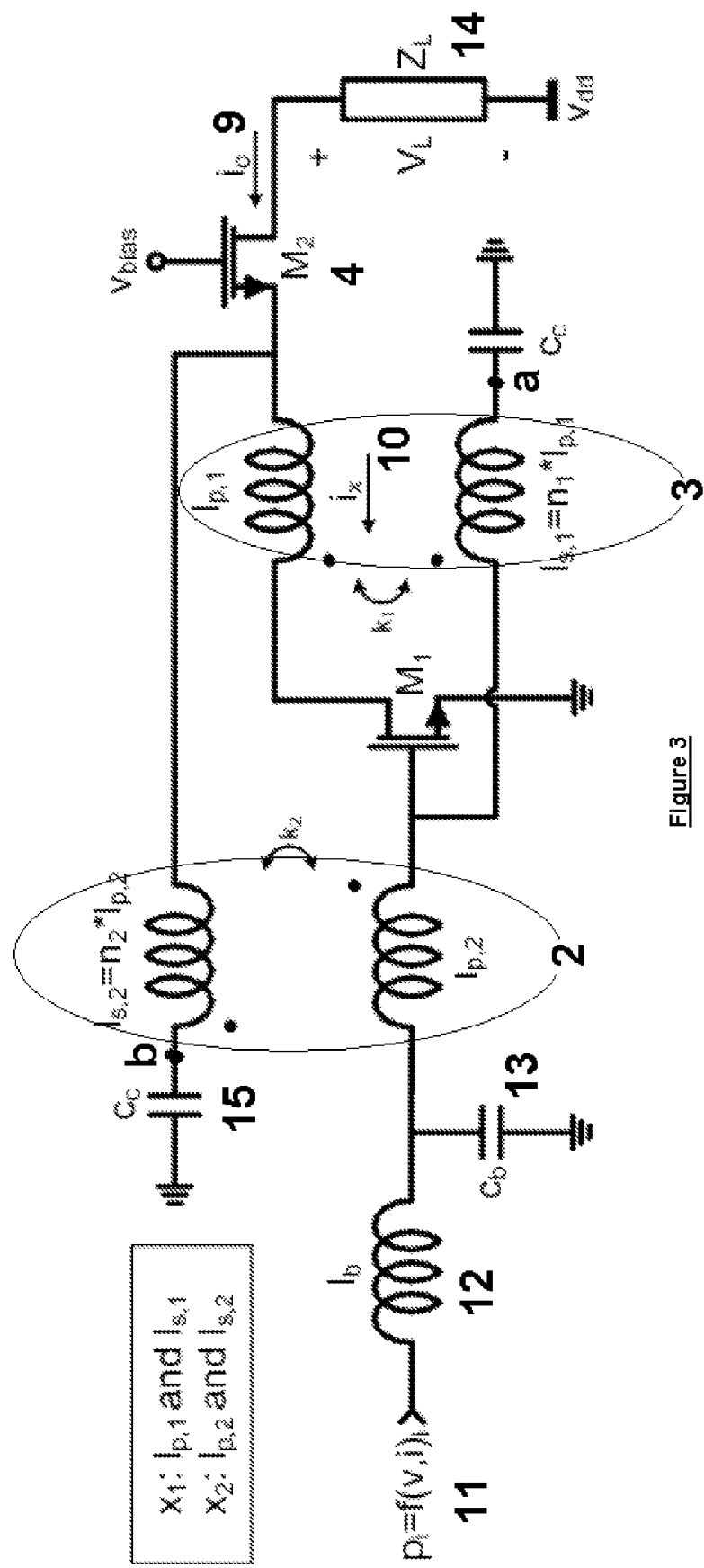
FIG. 3 shows a second preferred embodiment of an amplifying circuit of the invention, in particular a dual-loop feedback amplifier with output buffer.

The proposed power-to-current (P-I) amplifier (see FIG. 2) comprises a single common-source stage ($M_1$) (1), two reactive networks (2) and (3) formed using transformers ($x_1$ and $x_2$) preferably followed by an output current buffer ($M_2$) (4) (see FIG. 3). The transformers comprise: $x_1$: $I_{p1}$ (primary) (5) and $I_{s1}$ (secondary) (6) and $x_2$: $I_{p2}$ (primary) (7) and $I_{s2}$ (secondary) (8). Note that $x_1$ is in non-inverting configuration and $x_2$ is in inverting configuration. In FIG. 3, $i_o$ is the output current (9), $i_x$ (10) and $v_x$ denote the intermediate current and voltage quantities used for feedback, $p_i$ (11) is the input power (a function of the input voltage and current (i.e., f(v,i)$_i$)), $k_1$ and $k_2$ are the coupling coefficients of $x_1$ and $x_2$, respectively, and $I_b$ (12) and $c_b$ (13) represent the bond wire inductance and bond pad capacitance, respectively and $Z_L$ (14) is the output impedance. Note that capacitors, $c_c$ (15), AC ground one of the terminals of the secondary windings of $x_1$ and $x_2$.

To obtain a suitable noise figure while sustaining sufficient gain for the amplifier, the first stage (i.e., $M_1$) is biased (either independently or self-biased) between optimum noise and $f_T$ (transit frequency of a MOSFET) points.

In FIG. 3, an output current buffer ($M_2$) (4) is placed at the output of the amplifier of the present invention. The current buffer allows for a high impedance output node and its input impedance (i.e., inverse of its transconductance ($1/g_{m2}$)), sets the amount of positive feedback (i.e., voltage-to-current).

The positive feedback loop works as follows: the intermediate voltage (i.e., $v_x$ or the voltage at source of $M_2$ (4)) is sensed through $I_{s,2}$ (7) and added in series (through $I_{p,2}$ (8)) at the gate of $M_1$ (1), thereby increasing the transconductance of the first stage by a factor $a_i$ without increasing either the bias current or the aspect ratio. As for the negative feedback loop, the intermediate current is sensed by the primary winding $I_{p,1}$ (5) of $x_1$ and added (through $I_{s,1}$ (6)) to the gate of the first stage, thus providing an orthogonal noise and impedance matching. Overall, the transconductance $g_{m1}$ is enhanced or 'boosted' (by a factor $\sqrt{n_2}/k_2$) by employing a positive feedback loop as previously seen. $n_2^{1/2}$ is the turns ratio (i.e., number of turns on its secondary divided by the number of turns on its primary windings) of $x_2$. Note that to ensure that transistor $M_1$ always remains in saturation, points 'a' and 'b' can be tied together.

Figure 4:
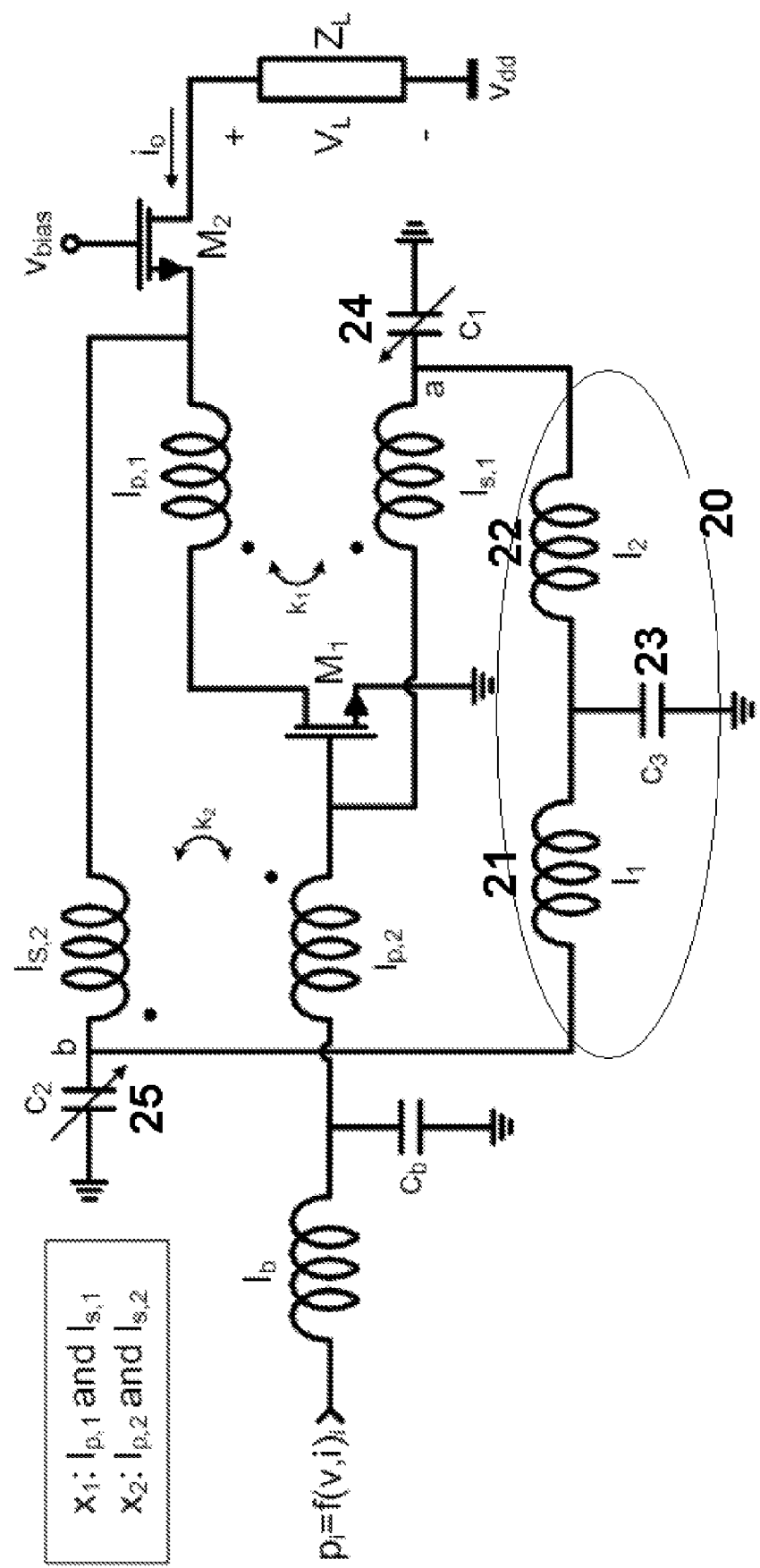
FIG. 4 shows a third preferred embodiment of an amplifying circuit of the invention, in particular a dual-loop negative feedback band-reject amplifier with 2 notches.

In FIG. 4, the amplifier is modified to have two programmable notches of at least 10 dB (typical value) in the IEEE802.11a WLAN band. Two notches are formed in the pass-band as a result of the LC network (20) incorporated at the AC ground terminals of the secondary windings of the two transformers. For the realization of these two notches, inductors ($I_1$ and $I_2$) (21) and (22), a capacitor ($c_3$) (23) and 2 varactors (or capacitor banks) ($c_1$ and $c_2$) (24) and (25) are employed as shown in FIG. 4. Capacitor $c_3$ (23) acts as an AC ground, while $c_1$ and $c_2$ (24) and (25) make up the resonant tanks with $I_1$ and $I_2$ (21) and (22), respectively, thus realizing two programmable notches.

Figure 5:
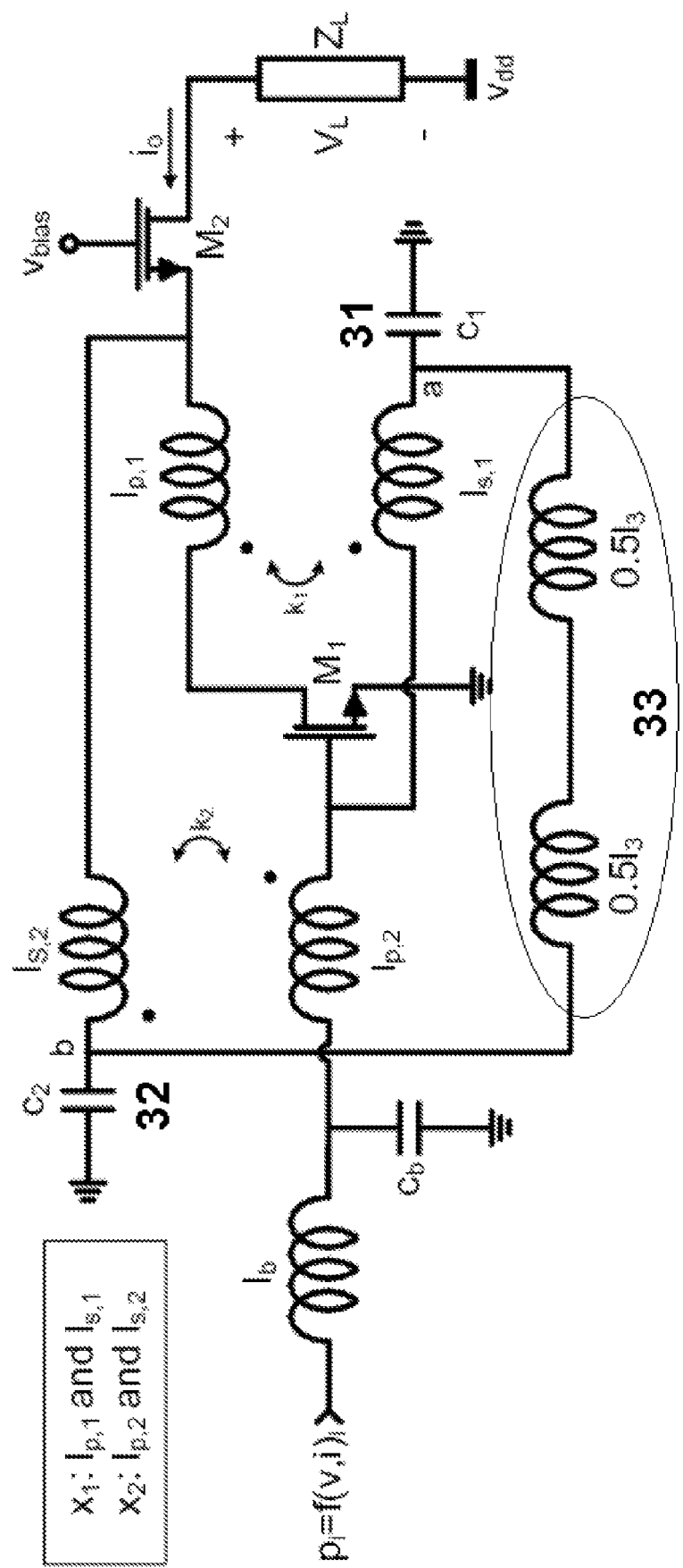
FIG. 5 shows a fourth preferred embodiment of an amplifying circuit of the invention, in particular a dual-loop negative feedback band-reject LNA with 1 wideband notch.

A single wideband (e.g., 500 MHz) notch amplifier is also proposed (see FIG. 5). Here, varactors $c_1$ and $c_2$ (31) and (32) are replaced with capacitors and an inductor $I_3$ (33) is placed between points 'a' and 'b' to form the resonant tank.

The two loops are intertwined or nested together with the negative feedback loop preferably being the dominant loop (to ensure stability). The positive feedback loop can boost the overall gain by several decibels. Both loops are interdependent. This dependency can be illustrated by the following equations.

The equations will be formulated for the input impedance and the transducer gain, both with and without positive feedback. These equations will allow us to fully comprehend the effect of positive feedback on the power gain and input impedance. The equations give a first order approximation of the power gain and input impedance (without taking parasitics into account). Note that by changing the $1/g_{m2}$ of $M_2$, the positive feedback factor changes.

The input impedance ($z_{in}$) and transducer gain ($g_t$) of the amplifier with only negative feedback is $$z_{in}=(1/g_{m1})(\sqrt{n_1}/k_1) \quad (1)$$

and $$g_t=(g_{m1})(\sqrt{n_1}/k_1)Z_L \quad (2)$$

whereas, with both negative and positive feedback, the extra variable, $a_i$ ($k_2/\sqrt{n_2}$) allows for more control over the input impedance as in, $$z_{in}=(1/g_{m1})(\sqrt{n_1}/k_1)(k_2/\sqrt{n_2}) \quad (3)$$

while simultaneously enhancing the transducer gain by boosting the effective transconductance of the first stage.

$$g_t=g_{m1}(\sqrt{n_1}/k_1)(\sqrt{n_2}/k_2)Z_L \quad (4)$$

where $g_{m1}$ is the intrinsic transconductance of the common source stage $M_1$, $n_1^{1/2}$ and $n_2^{1/2}$ are the turns ratios of $x_1$ and $x_2$, respectively with coupling ratios of $k_1$ and $k_2$. Note that the Re[$Z_L$] is typically 50 Ohms.

The transconductance (i.e., directly proportional to the bias current and aspect ratio) of the first stage and the parameters of $x_1$ and $x_2$ (i.e., self-inductances of the primary and the secondary windings, effective turns ratio and coupling coefficients), sets the input impedance (real and/or imaginary) and the gain of the amplifier.

In broadband amplifier designs, reactive feedback increases linearity without increasing thermal noise. Hence, linearity can be considered an important figure of merit for any amplifier. The 1-dB compression point (1-dB) of the amplifier is a useful parameter to predict low-level intermodulation effects. It is often the case that linearity of an amplifier deteriorates as frequency increases. However, with transformer feedback the effects are not as profound. With respect to noise, as the transformer produces less mutual flux linkage and mutual inductance at lower frequencies, the noise figure is greater.

A flat group delay or a linear phase response is paramount in broad-/(ultra-) wide-band amplifier design. An amplifier with non-linear group delay is all but likely to experience phase distortion.

The said amplifier modified to a pseudo-differential structure, as the latter is least sensitive to noise and interference coupled through supply lines and substrate. Moreover, differential topologies offer excellent common-mode rejection and suppress $2^{nd}$-order inter-modulation (IM) products. Moreover, these structures also accommodate differentially antennas, without the need for an input balun.

Figure 6:
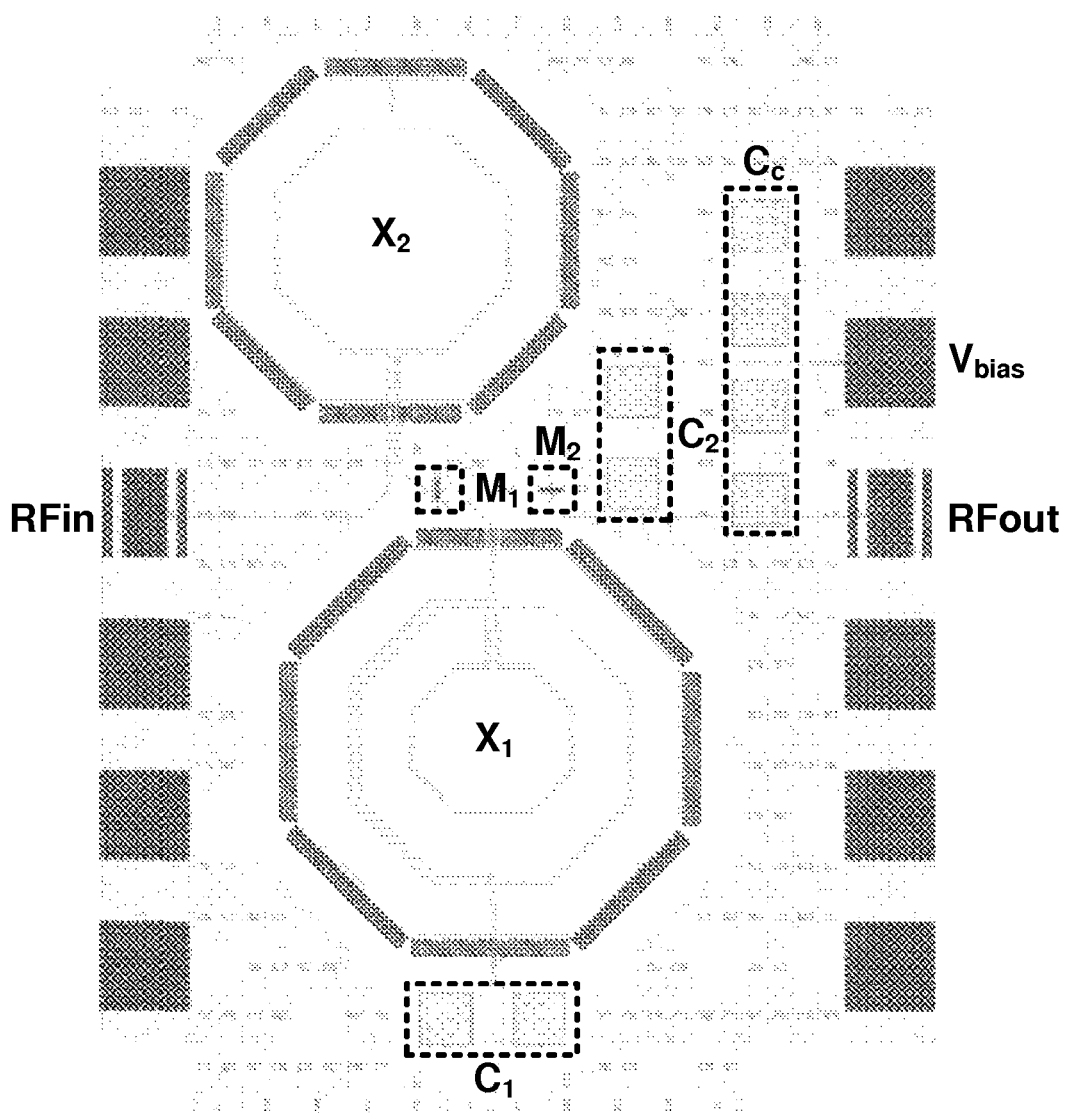
FIG. 6 shows a layout of a dual-loop nested feedback amplifier according to the invention.
Figure 7:
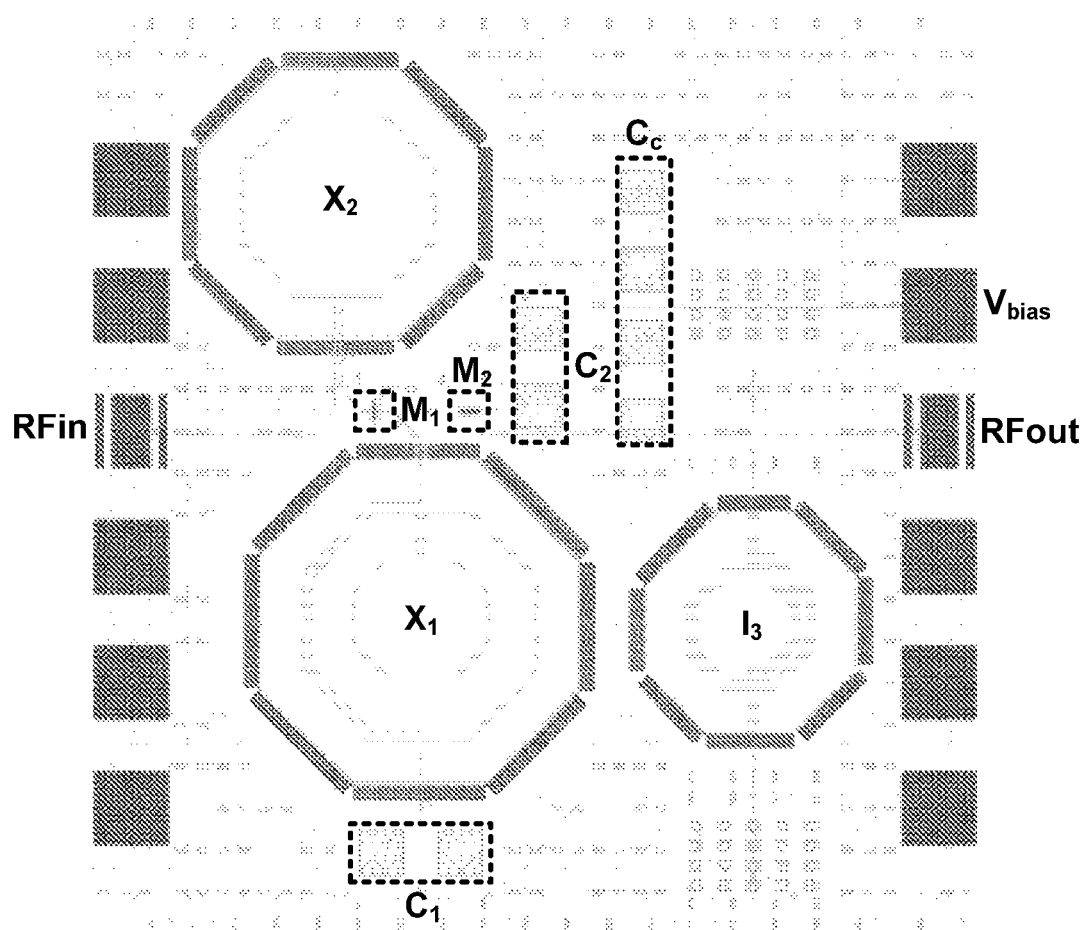
FIG. 7 shows a layout of another dual-loop nested feedback amplifier according to the invention.

Summarizing, dual-loop reactive feedback is presented as a potential topology for future UWB applications. Reactive feedback loops are constructed using on-chip monolithic transformers. Examples of possible layouts are shown in FIG. 6 and FIG. 7. FIG. 6 shows the layout of a dual-loop nested feedback amplifying circuit (having physical dimensions of 800×1100 µm²). FIG. 7 shows a layout of a dual-loop nested feedback amplifying circuit with at least 10 dB rejection for IEEE802.11a WLAN band (Physical dimensions: 1100×1100 µm²).

The invention claimed is:

1. An amplifying circuit configured to convert an input signal into an amplified output signal comprising:
    an input node at an input side of said circuit and configured to receive said input signal;
    an output node at an output side of said circuit and configured to output said amplified output signal;
    a first gain element connected between said input and output nodes, the first gain element configured to convert an input voltage taken from said input signal into a current for forming said amplified output signal;
    a negative feedback loop over said first gain element, said negative feedback loop having first elements configured to provide input matching, wherein said first elements of said negative feedback loop comprise primary and secondary windings of a first transformer arranged in non-inverting configuration, and wherein said primary winding of said first transformer is configured to sense said current and said secondary winding of said first transformer is configured to add said sensed current to a gate of said first gain element; and
    a positive feedback loop over said first gain element, said positive feedback loop having second elements configured to provide additional input matching and gain enhancement of said first gain element.

2. An amplifying circuit according to claim 1, wherein said first gain element comprises a first transistor having a gate connected to said input node.

3. An amplifying circuit according to claim 2, wherein the circuit further comprises a second gain element configured to form an output current buffer.

4. An amplifying circuit according to claim 3, wherein the second gain element comprises a second transistor having programmable biasing conditions for programming the impedance and gain of the amplifying circuit.

5. An amplifying circuit according to claim 4, wherein the second transistor has a gate connected to a programming node for receiving programming voltage.

6. An amplifying circuit according to claim 1, wherein said first gain element comprises a cascade of transistors.

7. An amplifying circuit according to claim 1, wherein said second elements of said positive feedback loop comprise primary and secondary windings of a second transformer arranged in inverting configuration.

8. An amplifying circuit according to claim 7, wherein said primary winding of said second transformer is configured to sense a voltage on said output side of said circuit related to said output signal and said secondary winding of said second transformer is configured to add said sensed voltage to a gate of said first gain element.

9. An amplifying circuit according to claim 1, wherein said positive and negative feedback loops comprise nested transformers.

10. An amplifying circuit according to claim 1, further comprising at least one LC network connected to a ground terminal of the secondary winding of the first and/or second transformer, and configured to form a notch in the pass-band of said amplifying circuit.

11. An amplifying circuit according to claim 10, wherein said at least one LC network comprises variable capacitors.

12. A communication device comprising an amplifying circuit, the amplifying circuit comprising:
    an input node configured to receive an input signal;
    an output node configured to output an amplified output signal;
    a first gain element connected between the input and output nodes, wherein the first gain element configured to convert an input voltage associated with the input signal into a current associated with the amplified output signal;
    a negative feedback loop associated with the first gain element, wherein the negative feedback loop comprises first elements configured to provide input matching, wherein said first elements of said negative feedback loop comprise primary and secondary windings of a first transformer arranged in non-inverting configuration, and wherein said primary winding of said first transformer is configured to sense said current and said secondary winding of said first transformer is configured to add said sensed current to a gate of said first gain element; and
    a positive feedback loop associated with the first gain element, wherein the positive feedback loop comprises second elements configured to provide additional input matching and gain control of said first gain element.

* * * * *

UNITED STATES PATENT AND TRADEMARK OFFICE
CERTIFICATE OF CORRECTION

PATENT NO. : 8,446,217 B2
APPLICATION NO. : 13/054036
DATED : May 21, 2013
INVENTOR(S) : Sumit Bagga It is certified that error appears in the above-identified patent and that said Letters Patent is hereby corrected as shown below:

Title Page, Item (73) Assignee: should read

--(73) Assignee: Stichting IMEC Nederland, Leuven (BE)--.

Signed and Sealed this
Twenty-third Day of July, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,446,217 B2
APPLICATION NO. : 13/054036
DATED : May 21, 2013
INVENTOR(S) : Sumit Bagga It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 32 days.

Signed and Sealed this
Eighth Day of September, 2015

Michelle K. Lee
*Director of the United States Patent and Trademark Office*